(12) United States Patent
Oguri et al.

(10) Patent No.: US 9,377,237 B2
(45) Date of Patent: Jun. 28, 2016

(54) REFRIGERATION APPARATUS

(71) Applicant: DAIKIN INDUSTRIES, LTD., Osaka-shi, Osaka (JP)

(72) Inventors: Akihiko Oguri, Shanghai (CN); Junichi Teraki, Kusatsu (JP); Masanobu Kita, Kusatsu (JP); Hiroshi Doumae, Sakai (JP); Motonobu Ikeda, Sakai (JP); Masahide Fujiwara, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 14/395,301

(22) PCT Filed: Apr. 8, 2013

(86) PCT No.: PCT/JP2013/002400
§ 371 (c)(1),
(2) Date: Oct. 17, 2014

(87) PCT Pub. No.: WO2013/157218
PCT Pub. Date: Oct. 24, 2013

(65) Prior Publication Data
US 2015/0114021 A1    Apr. 30, 2015

(30) Foreign Application Priority Data

Apr. 20, 2012  (JP) ................................ 2012-096841

(51) Int. Cl.
*F25D 23/00* (2006.01)
*H05K 1/02* (2006.01)
(Continued)

(52) U.S. Cl.
CPC . *F25D 23/00* (2013.01); *F24F 1/24* (2013.01); *F25D 31/00* (2013.01);
(Continued)

(58) Field of Classification Search
CPC ....... F25D 23/00; F25D 31/00; H01L 23/367; H01L 23/4006; H01L 23/473; H01L 23/427; H01L 2023/405; H01L 2023/4068; H01L 2023/4087; H05K 1/0272; H05K 1/0203; H05K 7/20; H05K 7/20927; H05K 7/20936; F28F 9/013
See application file for complete search history.

(56) References Cited

U.S. PATENT DOCUMENTS 4,293,175 A * 10/1981 Cutchaw ............. H01L 23/4006
                                                         257/E23.084
4,720,981 A *  1/1988 Helt et al. ........................ 62/113
(Continued)

FOREIGN PATENT DOCUMENTS

EP    0777271 A2    6/1997
EP    1372367 A1   12/2003
(Continued)

OTHER PUBLICATIONS

International Search Report for PCT/JP2013/002400 mailed on Jun. 25, 2013.

*Primary Examiner* — Mohammad M Ali
*Assistant Examiner* — Christopher R Zerphey
(74) *Attorney, Agent, or Firm* — Birch, Stewart, Kolasch & Birch, LLP

(57) ABSTRACT

A facing surface of a refrigerant jacket includes a contact portion which contacts a device main body, a first recessed portion which faces a first lead section and secures an insulation distance to the first lead section due to being positioned further away from a power device than the contact portion, and a second recessed portion which faces the second lead section and secures an insulation distance to the second lead section due to being positioned further away from the power device than the contact portion.

5 Claims, 11 Drawing Sheets

(51) Int. Cl.
  *H01L 23/473*   (2006.01)
  *H05K 7/20*    (2006.01)
  *H01L 23/40*   (2006.01)
  *F25D 31/00*   (2006.01)
  *F24F 1/24*    (2011.01)
  *H01L 23/367*  (2006.01)

(52) U.S. Cl.
  CPC ......... *H01L 23/4006* (2013.01); *H01L 23/473* (2013.01); *H05K 1/0203* (2013.01); *H05K 7/20927* (2013.01); *H01L 23/367* (2013.01); *H01L 2023/405* (2013.01); *H01L 2924/0002* (2013.01)

(56) References Cited

U.S. PATENT DOCUMENTS

| | | | |
|---|---|---|---|
| 5,672,910 A | 9/1997 | Majumdar et al. | |
| 6,518,868 B1* | 2/2003 | Miller et al. | 336/55 |
| 6,979,784 B1* | 12/2005 | Duley | 174/260 |
| 2005/0146023 A1* | 7/2005 | Edwards | H01L 23/4093 257/707 |
| 2005/0218505 A1* | 10/2005 | Oman et al. | 257/702 |
| 2009/0205810 A1* | 8/2009 | Wan et al. | 165/80.4 |
| 2011/0126568 A1* | 6/2011 | Okuda et al. | 62/259.2 |

FOREIGN PATENT DOCUMENTS

| | | |
|---|---|---|
| EP | 2109138 A1 | 10/2009 |
| JP | 61-260660 A | 11/1986 |
| JP | 9-153574 A | 6/1997 |
| JP | 10-41441 A | 2/1998 |
| JP | 2003-31746 A | 1/2003 |
| JP | 2009-295916 A | 12/2009 |

\* cited by examiner

REFRIGERATION APPARATUS

TECHNICAL FIELD

The present invention relates to a refrigeration apparatus provided with a refrigerant jacket for cooling a power device.

BACKGROUND ART

Conventionally, an air-conditioning apparatus, for example, is known as one kind of refrigeration apparatus that is provided with a refrigerant circuit. An outdoor unit of the air-conditioning apparatus is equipped with a compressor, a heat exchanger, a fan, an electrical component module, and the like. The electrical component module is provided with a printed circuit board for performing operational control of the refrigerant circuit. The printed circuit board is provided with a plurality of electronic components and a printed wiring board on which these electronic components are mounted. The electronic components in the printed circuit board include power devices which are likely to generate heat, such as an inverter for compressor control, an inverter for fan control, or the like.

Patent Literature 1 proposes a refrigeration apparatus provided with a refrigerant jacket for cooling a power device such as that described above. With this refrigeration apparatus, it is possible to cool the power device by a refrigerant flowing in a refrigerant circuit.

The refrigerant jacket is made from a metal material, such as aluminum, for example, in order to obtain good thermal conductivity, and an insulation sheet is provided between the refrigerant jacket and the power device (see FIG. 6 of Patent Literature 1). By providing an insulation sheet of this kind, it is possible to secure insulating properties between the lead sections of the power device and the refrigerant jacket, but the cost is increased due to the cost of the insulation sheet, and furthermore, a step for interposing the insulating sheet between the lead sections and the refrigerant jacket becomes necessary.

CITATION LIST

Patent Literature

Patent Literature 1: Japanese Patent Application Publication No. 2009-295916

SUMMARY OF INVENTION

It is an object of the present invention to provide a refrigeration apparatus which is capable of ensuring insulating properties between a refrigerant jacket and a lead section of a power device, without providing an insulation sheet.

The present invention relates to a refrigeration apparatus having a refrigerant circuit. The refrigeration apparatus includes: a power device; a printed wiring board on which the power device is mounted; a refrigerant pipe through which a refrigerant of the refrigerant circuit flows; and a refrigerant jacket which has a facing surface that is in contact with the power device and faces the printed wiring board, the refrigerant jacket cooling the power device by refrigerant flowing in a cooling portion, which is a portion of the refrigerant pipe.

The power device includes: a device main body; a first lead section which extends towards the printed wiring board from one side of the device main body and which is connected to the printed wiring board; and a second lead section which extends towards the printed wiring board from the other side of the device main body and which is connected to the printed wiring board.

The facing surface of the refrigerant jacket includes: a contact portion which contacts the device main body; a first recessed portion which faces the first lead section and secures an insulation distance to the first lead section due to being positioned further away from the power device than the contact portion; and a second recessed portion which faces the second lead section and secures an insulation distance to the second lead section due to being positioned further away from the power device than the contact portion.

DESCRIPTION OF EMBODIMENTS

Below, a refrigeration apparatus relating to an embodiment of the present invention will be described with reference to the drawings. In the embodiment described below, an example is given in which the refrigeration apparatus is an air-conditioning apparatus 1.

<Air-Conditioning Apparatus>

Figure 1:
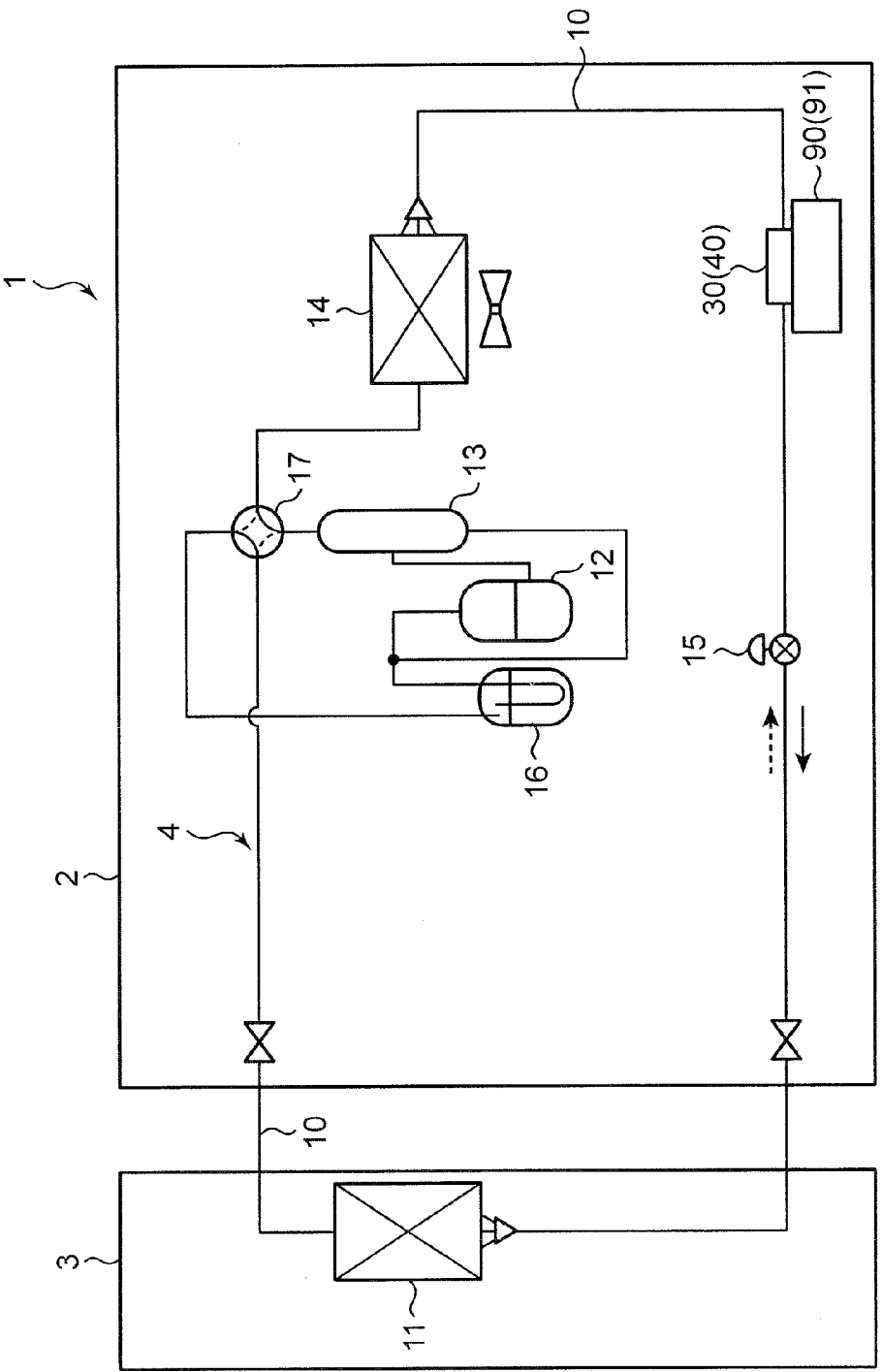
FIG. 1 is a view showing a schematic composition of the air-conditioning apparatus which is a refrigeration apparatus relating to one embodiment of the present invention.

As shown in FIG. 1, the air-conditioning apparatus 1 is provided with an outdoor unit 2 which is disposed outdoors, and an indoor unit 3 which is disposed indoors. The outdoor unit 2 and the indoor unit 3 are mutually connected by connection pipes. The air-conditioning apparatus 1 is provided with a refrigerant circuit 4 which carries out a vapor compression refrigeration cycle. The refrigerant circuit 4 principally includes an indoor heat exchanger 11, a compressor 12, an oil separator 13, an outdoor heat exchanger 14, an expansion valve 15, which is an expansion mechanism, an accumulator 16, and a four-way switching valve 17, and these are connected by a refrigerant pipe 10 in which the refrigerant of the refrigerant circuit 4 flows.

The indoor heat exchanger 11 is a heat exchanger for the refrigerant to exchange heat with the indoor air, and is provided in the indoor unit 3. For the indoor heat exchanger 11, it is possible to use, for example, a cross-fin type of fin-and-tube heat exchanger, or the like. An indoor fan (not illustrated) for blowing the indoor air to the indoor heat exchanger 11 is provided in the vicinity of the indoor heat exchanger 11.

The compressor 12, the oil separator 13, the outdoor heat exchanger 14, the expansion valve 15, the accumulator 16 and the four-way switching valve 17 are provided in the outdoor unit 2. These elements are all accommodated inside a casing 5 (see FIG. 2).

The compressor 12 has an intake port, a compression mechanism and a discharge port, and refrigerant that has been sucked in via the intake port is compressed by the compression mechanism and is discharged from the discharge port. It is also possible to use various compressors, such as a scroll compressor, or the like, as the compressor 12.

The oil separator 13 serves to separate lubricating oil from the mixed fluid of lubricating oil and refrigerant which is discharged from the compressor 12. The separated refrigerant is sent to the four-way switching valve 17 and the lubricating oil is returned to the compressor 12.

The outdoor heat exchanger 14 serves for the refrigerant to exchange heat with the outdoor air, and may use, for example, a cross-fin type of fin-and-tube heat exchanger, or the like. An outdoor fan for blowing the outdoor air to the outdoor heat exchanger 14 is provided in the vicinity of the outdoor heat exchanger 14.

The expansion valve 15 is disposed between the outdoor heat exchanger 14 and the indoor heat exchanger 11 in the refrigerant circuit 4, and causes the refrigerant flowing into same to expand and decompress to a prescribed pressure. It is possible to adopt a variable-opening electronic expansion valve 15, for example, as the expansion valve 15.

The accumulator 16 performs gas/liquid separation of the refrigerant that has flowed into same, and is disposed between the intake port of the compressor 12 and the four-way switching valve 17 in the refrigerant circuit 4. The gas refrigerant which is separated in the accumulator 16 flows into the compressor 12.

Four ports, a first port to a fourth port, are provided in the four-way switching valve 17. The four-way switching valve 17 is capable of switching between a first state of communicating between the first port and the third port, while simultaneously communicating between the second port and the fourth port (the state indicated by the solid lines in FIG. 1), and a second state of communicating between the first port and the fourth port, while simultaneously communicating between the second port and the third port (the state indicated by the broken lines in FIG. 1). The first port is connected to the discharge port of the compressor 12 via the oil separator 13, the second port is connected to the intake port of the compressor 12 via the accumulator 16 the third port is connected to the outdoor heat exchanger 14, and the fourth port is connected to the indoor heat exchanger 11 via a connection pipe. When the air-conditioning apparatus 1 is performing a cooling operation, the four-way switching valve 17 is switched to the first state, and when performing a heating operation, the four-way switching valve 17 is switched to the second state.

A portion of the refrigerant pipe 10 of the refrigerant circuit 4 (the cooling portion 10A) is installed on the refrigerant jacket 40 for cooling the power device 20 of the printed circuit board 91 which is described below. In the present embodiment, taking account of the cooling properties, the liquid pipe, of the refrigerant pipe 10, is installed in the refrigerant jacket 40, as shown in FIG. 1. In the present embodiment, the liquid pipe installed in the refrigerant jacket 40 is a liquid pipe between the outdoor heat exchanger 14 and the expansion valve 15 in the refrigerant circuit 4, but the liquid pipe installed in the refrigerant jacket 40 is not limited to this.

During a cooling operation, the refrigerant that has been condensed in the outdoor heat exchanger 14 flows in the liquid pipe installed in the refrigerant jacket 40, and during a heating operation, refrigerant that has been condensed by the indoor heat exchanger 11 and has been decompressed by the expansion valve 15 flows in the liquid pipe installed in the refrigerant jacket 40. The temperatures of these refrigerants vary depending on the operating conditions, and so on, but during a heating operation is approximately 40° C. to 45° C.

<Outdoor Unit>

Figure 2:
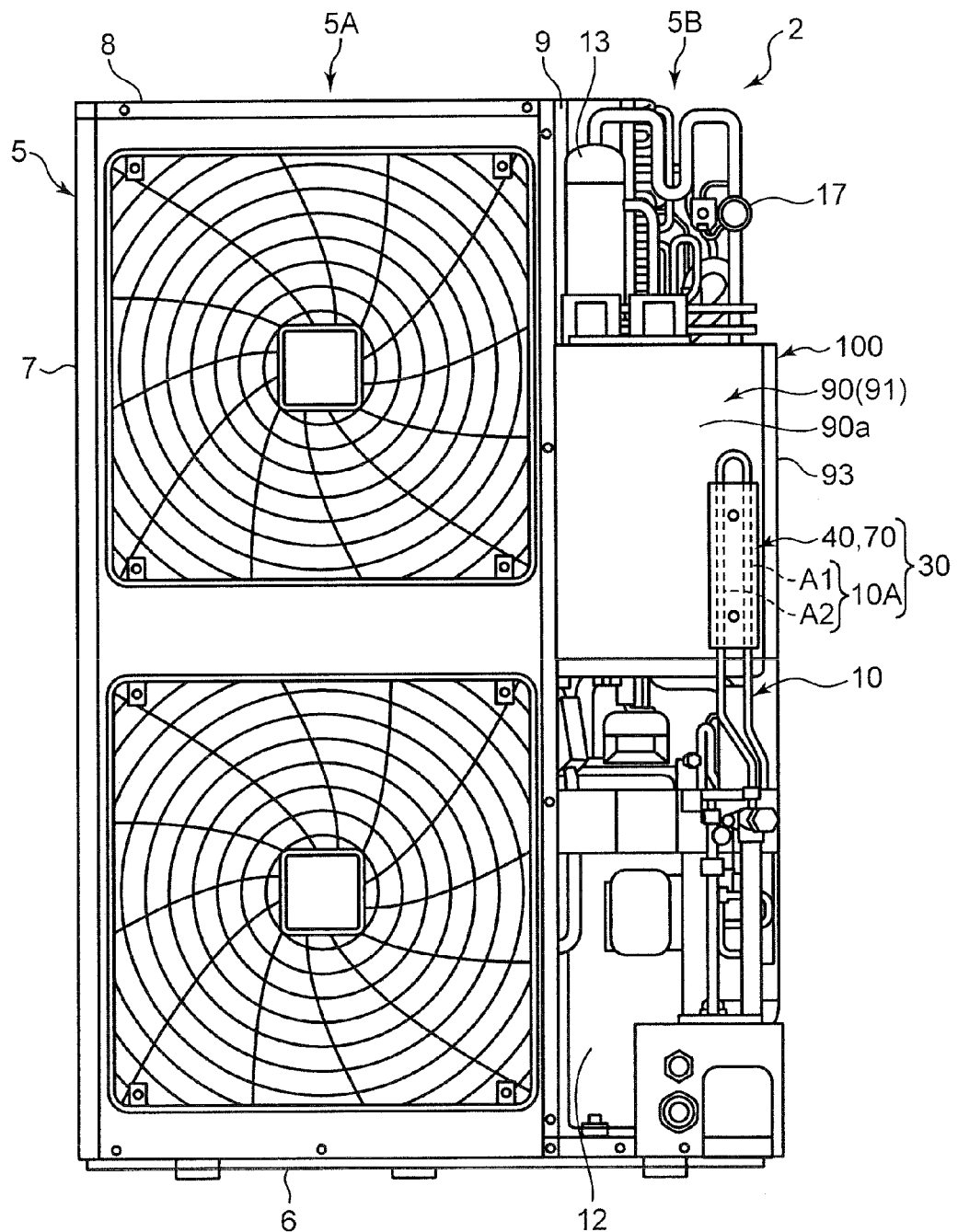
FIG. 2 is a front view showing an outdoor unit of the air-conditioning apparatus and shows a state in which a portion of the casing has been removed.

As shown in FIG. 2, the outdoor unit 2 is provided with a casing 5. The abovementioned compressor 12, oil separator 13, outdoor heat exchanger 14, expansion valve 15, accumulator 16, four-way switching valve 17, and the like, are accommodated inside the casing 5.

The casing 5 has a bottom plate 6, a side plate 7 which is erected upwardly at the peripheral portion of this bottom plate 6, and a ceiling plate 8 which is disposed on the upper end portion of the side plates 7, and overall has a substantially cuboid-shaped external appearance. A dividing plate 9 which divides the internal space of the casing 5 into two spaces is provided in the outdoor unit 2. This dividing plate 9 has a size reaching from the lower end portion to the upper end portion of the space inside the casing 5, and is erected on the bottom plate 6 of the casing 5. Due to this dividing plate 9, the space inside the casing 5 is divided into a heat exchange chamber 5A in which the outdoor heat exchanger 14 and the outdoor fan are accommodated, and a machine chamber 5B in which the compressor 12 and the electric component module 100, and the like, are accommodated. A blowing port for blowing out the air in the heat exchange chamber 5A, to outside the casing 5, is opened on the front surface of the casing 5.

The machine chamber 5B occupies a portion of the space inside the casing 5 (in the case of the embodiment shown in FIG. 2, the right-hand-side portion when the casing 5 is viewed from the front side). An electric component module 100 is disposed on the side of the opening which appears when a portion of the casing 5 that covers the machine chamber 5B is removed (the front side in the present embodiment). In the present embodiment, as shown in FIG. 2, one portion of the front surface of the casing 5 is opened by removing a portion of the front surface side plate of the casing 5 (the right-side portion of the front surface side plate is removed in FIG. 2). The electric component module 100 is disposed on the front side inside the machine chamber 5B.

The electric component module 100 is an electric component assembly for controlling the operation of the refrigerant circuit 4. The electric component module 100 is disposed in the vicinity of the front surface side plate such that the front surface of the electric component module 100 is substantially parallel to the front surface side plate on the front side of the casing 5. Consequently, when the portion of the front surface side plate of the casing 5 is removed during servicing, or the like, then the front surface of the electric component module 100 is exposed to the front side, as shown in FIG. 2.

In the present embodiment, the electric component module 100 is disposed in an intermediate portion of the height direction in the machine chamber 5B, but is not limited to this. The areas above and below the electric component module may be empty spaces, or may be used to dispose other components. The electric component module 100 is supported by (fixed on) the dividing plate 9 and the side plates of the casing 5, for example. The electric component module 100 includes a printed circuit board 91, a refrigerant jacket 40 and a temperature detection unit T. In the present embodiment, the electric component module 100 is also provided with a supporting member 93, which is provided on the rear surface side of the printed circuit board 91 and supports the printed circuit board 91, and a pressing plate 70.

The temperature detection unit T is fixed to the refrigerant jacket 40, the refrigerant jacket 40 is fixed to the printed circuit board 91, the printed circuit board 91 is supported by the supporting member 93, and the supporting member 93 is supported by the casing 5. Therefore, the electric component module 100 is supported by the casing 5.

<Cooling Structure of Power Device>

Next, a structure for cooling the power device 20 will be described. In the cooling structure of the present embodiment, the cooler 30 cools the power device 20 of the printed circuit board 91. The cooler 30 includes a refrigerant jacket 40, and a cooling portion 10A, which is a portion of the refrigerant pipe 10. In the present embodiment, the cooler 30 further includes a pressing plate 70 which is installed on the refrigerant jacket 40. The cooler 30 is described below.

(Printed Circuit Board)

Figure 3:
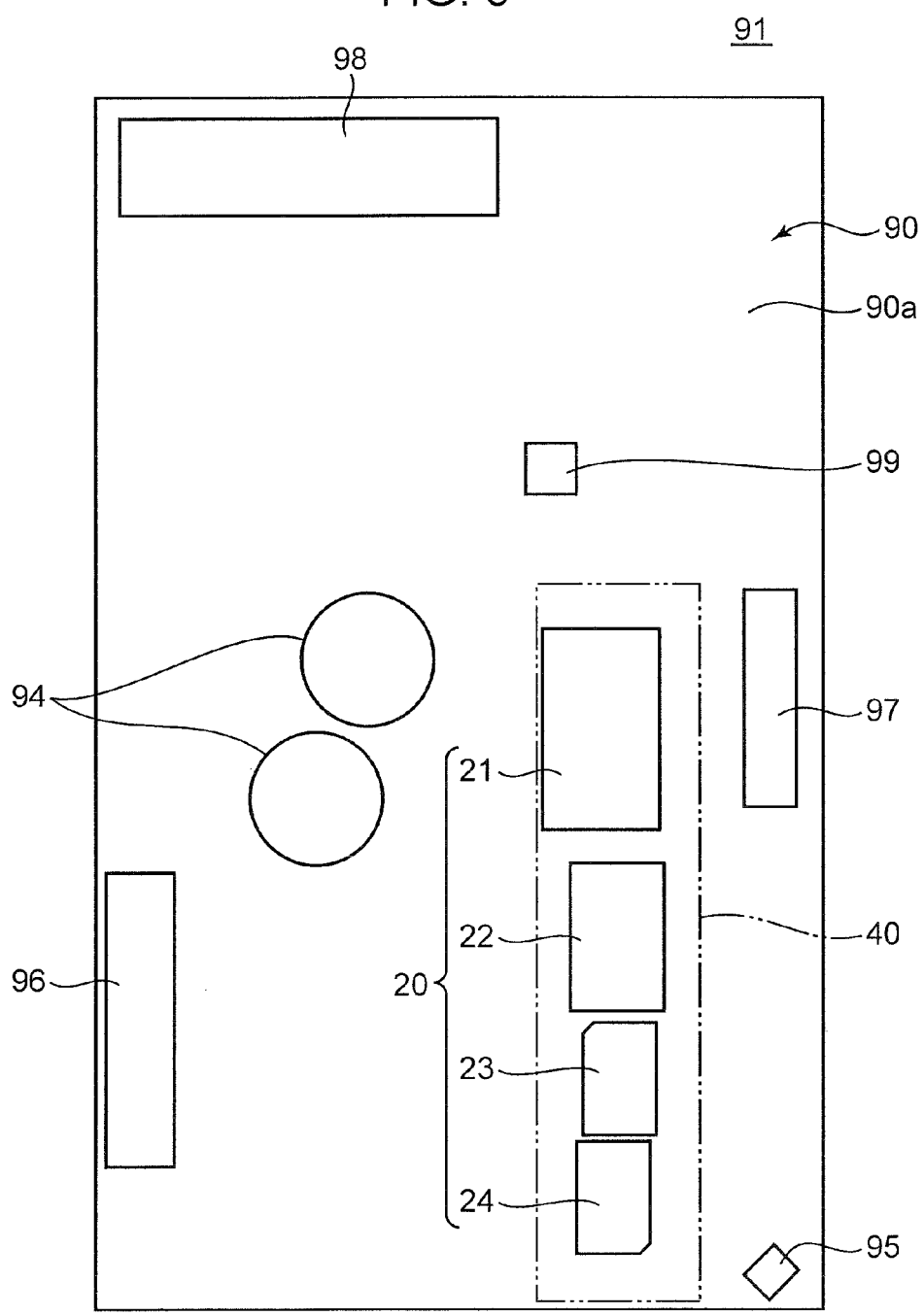
FIG. 3 is a front view showing a printed circuit board in the outdoor unit.

Firstly, the general composition of the printed circuit board 91 will be described. As shown in FIG. 2 and FIG. 3, the printed circuit board 91 includes various electronic components, and a printed wiring board 90 on which these electronic components are mounted. The printed wiring board 90 has a main surface (front surface) 90a which faces the side of an opening that appears when a portion of the casing 5 (a portion of the front surface side plate in the present embodiment) is removed. The printed wiring board 90 is supported by the supporting member 93 in an upright state. In the present embodiment, the printed wiring board 90 is disposed parallel to the vertical direction, but the invention is not limited to this and the printed wiring board 90 may also be disposed in an inclined fashion with respect to the vertical direction.

The electronic component includes a heavy electric component group, and a light electric component group 98. The heavy electric component group includes: a power device 20, an electrolytic capacitor 94, a reactor terminal 95, an input wire section 96 of a power source (not illustrated), and an inverter output wire section 97. The power device 20 includes an inverter and a converter. In the present embodiment, the power device 20 includes a first inverter 21 for controlling the compressor, a second inverter 22 for controlling the fan motor, and a first converter 23 and a second converter 24. The electric power input to the input wire section 96 from the power source flows successively to the converters 23, 24, the reactor terminal 95, the reactor (not illustrated), the electrolytic capacitor 94, the inverters 21, 22 and the output wire section 97. Apart from the electronic components described above, various other electronic components are mounted on the main surface 90a of the printed wiring board 90, such as a microcomputer 99, a noise filter (not illustrated), a setting switch, and a display unit capable of displaying the control operation status, and so on. The reactor terminal 95 and the reactor are connected by reactor wires (not illustrated). Possible examples of the inverters 21, 22 are semiconductor switching elements, such as IGBTs (Insulated Gate Bipolar Transistors), or the like.

In the present embodiment, the heavy electric component group is disposed in a lower region of the printed wiring board 90 (a heavy electric region), on the main surface 90a of the printed wiring board 90, and the light electric component group 98 is disposed in a region (a light electric region) located above the heavy electric region, but the invention is not limited to this.

The input wire section 96 is disposed on one side of the power device 20 (the left-hand side of the power device 20 in FIG. 3), and the output wire section 97 is disposed on the other side of the power device 20 (the right-hand side of the power device 20 in FIG. 3). The noise reduction effects can be improved by separating the input wire section 96 of the power source and the inverter output wire section 97 in this way.

The inverters 21, 22 and the converters 23, 24 are aligned in one row along one direction, on the main surface 90a of the printed wiring board 90. In the present embodiment, the first inverter 21, the second inverter 22, the first converter 23 and the second converter 24 are aligned in one row in the vertical direction, and are arranged in this order from the top.

Figure 4:
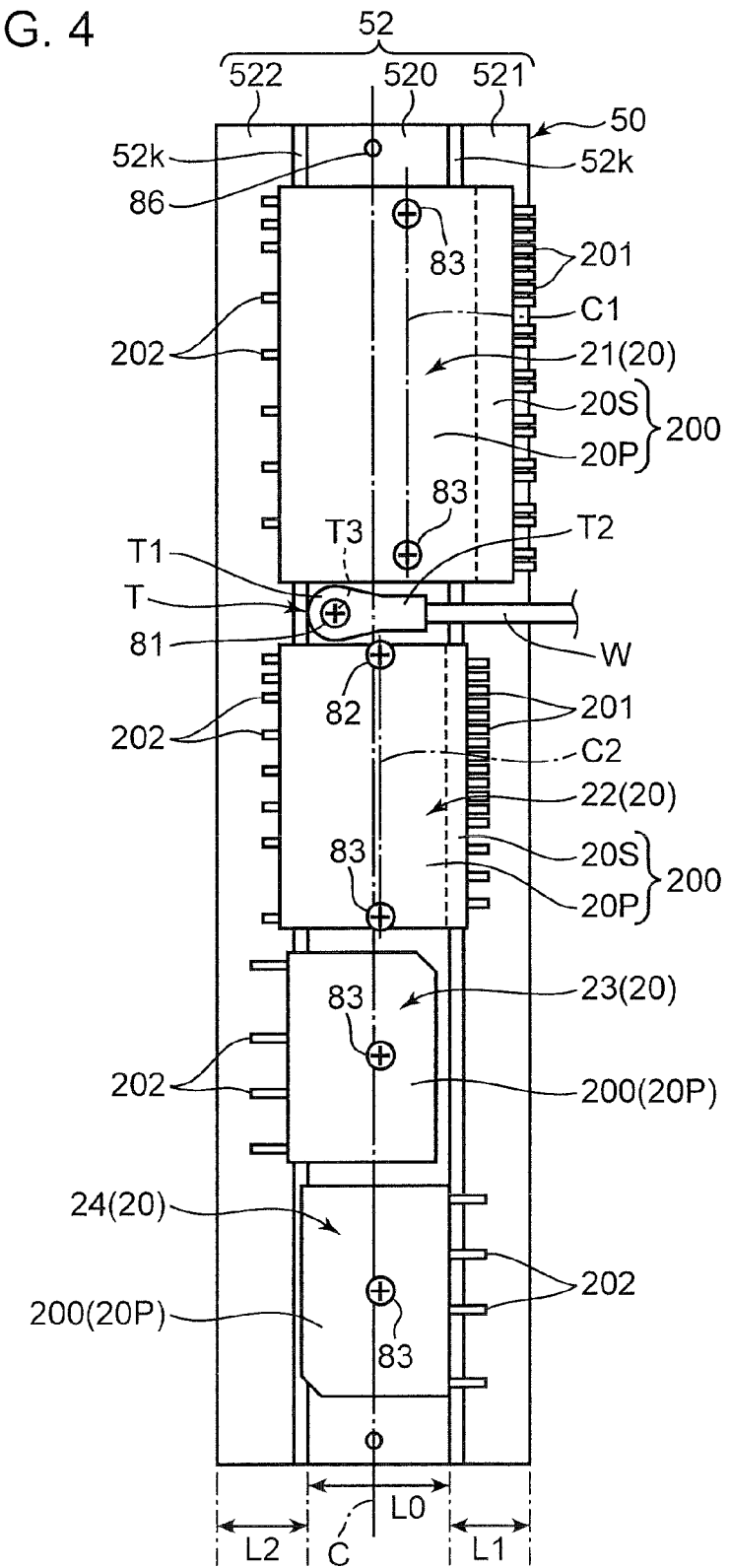
FIG. 4 is a rear view showing a state where a power device and a temperature detection unit are mounted on the facing surface of the refrigeration jacket in the outdoor unit.

As shown in FIG. 4, the first inverter 21 has a device main body 200, a first lead section 201, and a second lead section 202. The device main body 200 has a signal part 20S which is positioned on the side of the first lead section 201, and a heavy electric part 20P which is positioned on the side of the second lead section 202 and which is more liable to generate heat than the signal part 20S. The first lead section 201 is connected to the signal part 20S and the second lead section 202 is connected to the heavy electric part 20P. The approximate boundary between the signal part 20S and the heavy electric part 20P is indicated by the broken lines in FIG. 4.

Similarly, the second inverter 22 has a device main body 200, a first lead section 201, and a second lead section 202. The device main body 200 has a signal part 20S which is positioned on the side of the first lead section 201, and a heavy electric part 20P which is positioned on the side of the second lead section 202 and which is more liable to generate heat than the signal part 20S. The first lead section 201 is connected to the signal part 20S and the second lead section 202 is connected to the heavy electric part 20P. The approximate boundary between the signal part 20S and the heavy electric part 20P in the second inverter 22 is indicated by the broken line in FIG. 4.

The first lead section 201 of the first inverter 21 and the first lead section 201 of the second inverter 22 are each extended towards the printed wiring board 90 from one side of the device main body 200 and are each connected to the printed wiring board 90. The second lead section 202 of the first inverter 21 and the second lead section 202 of the second inverter 22 are each extended towards the printed wiring board 90 from the other side of the device main body 200 and are each connected to the printed wiring board 90.

The first converter 23 has a device main body 200 and a lead section 202. Similarly, the second converter 24 has a device main body 200 and a lead section 202. Substantially the whole of the device main bodies 200 of the first converter 23 and the second converter 24 is composed by a heavy electric part which is liable to generate heat.

(Cooler)

Below, the cooler 30 is described. As mentioned above, the cooler 30 according to the present embodiment includes the refrigerant jacket 40, the cooling portion 10A of the refrigerant pipe 10, and the pressing plate 70 which is installed on the refrigerant jacket 40.

The cooling portion 10A constitutes one portion of the refrigerant pipe 10. Refrigerant at a temperature capable of cooling the power device 20 flows in the cooling portion 10A. In the present embodiment, as shown in FIG. 1, the cooling portion 10A is one portion of a liquid pipe which is positioned between the outdoor heat exchanger 14 and the expansion valve 15. In the present embodiment, one portion of the liquid pipe has a shape bent into a U-shaped form, as shown in FIG. 2, and this U-shaped portion functions as a cooling portion 10A. The end section (curved section) of the U-shaped portion is positioned outside the refrigerant jacket 40. Furthermore, in the present embodiment, one portion of the liquid pipe is disposed in such a manner that the curved section (the end section) of the U-shaped portion in the casing 5 is situated uppermost, but the invention is not limited to this.

Figure 5:
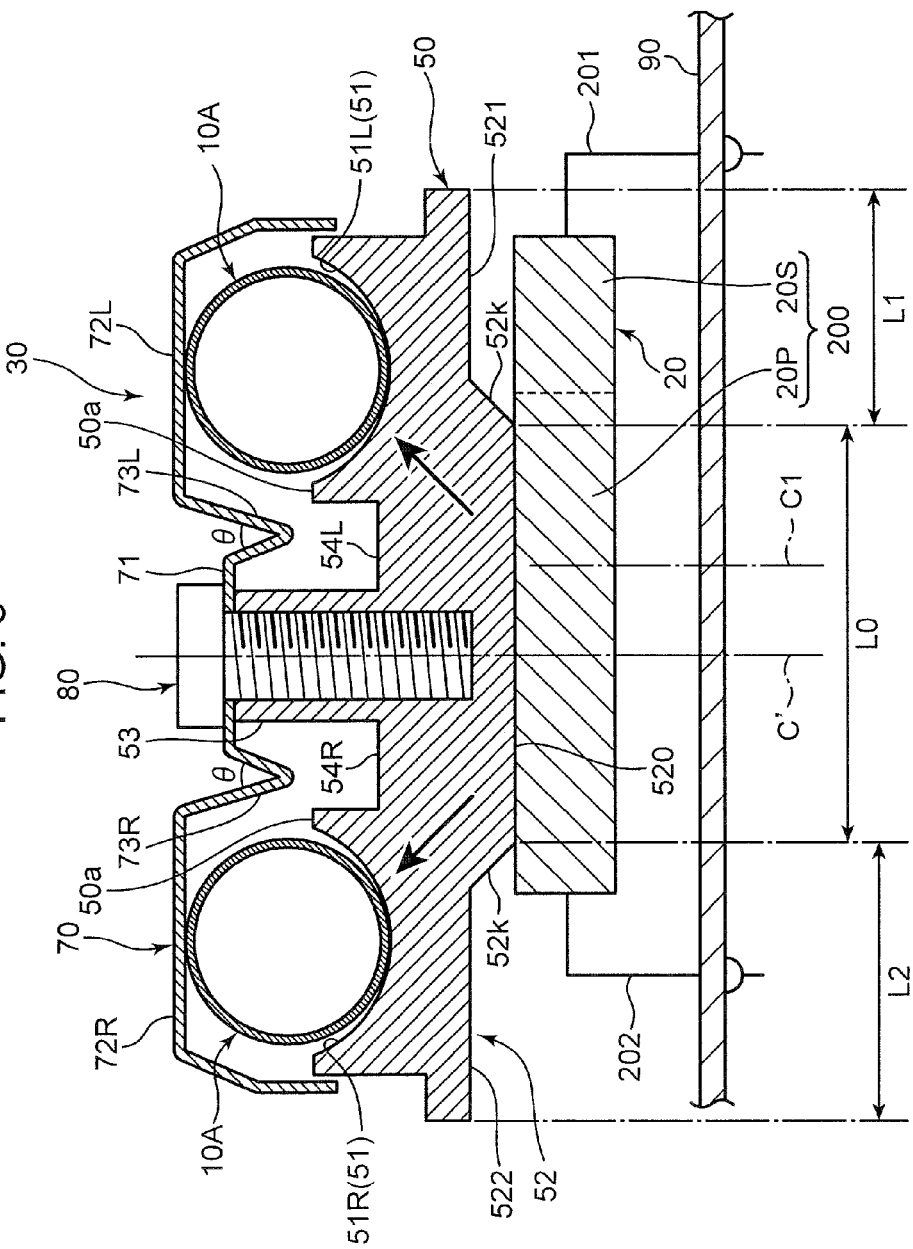
FIG. 5 is a cross-sectional view showing an arrangement of the refrigerant jacket, the pressing plate, the cooling portion of the refrigerant pipe, the power device (first inverter) and the printed wiring board.
Figure 6:
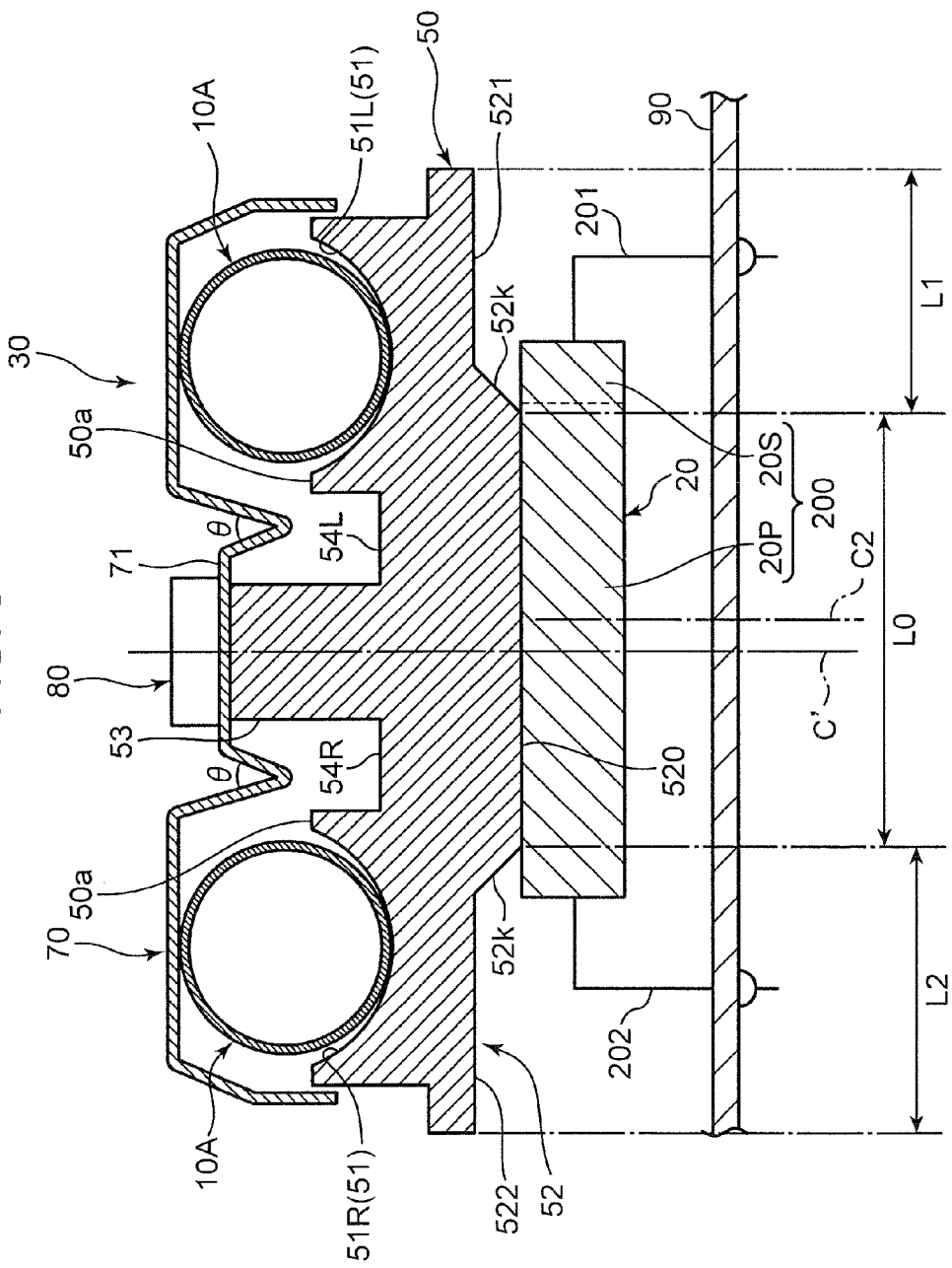
FIG. 6 is a cross-sectional view showing an arrangement of the refrigerant jacket, the pressing plate, the cooling portion of the refrigerant pipe, the power device (second inverter) and the printed wiring board.

As shown in FIG. 2, FIG. 5 and FIG. 6, the cooling portion 10A has a first cooling portion A1 and a second cooling portion A2, and the first cooling portion A1 and the second cooling portion A2 extend, parallel to each other, in the vertical direction. The first cooling portion A1 and the second cooling portion A2 are connected via the curved section. The upstream side portion of the refrigerant pipe 10 which connects to the upstream side of the cooling portion 10A (the upstream side of the first cooling portion A1) extends upwards towards the power device 20 of the printed circuit board 91 inside the casing 5, and the downstream side portion of the refrigerant pipe 10 which connects to the downstream side of the cooling portion 10A (the downstream side of the second cooling portion A2) extends downwards from the power device 20 of the printed circuit board 91 inside the casing 5. The cooling portion 10A extends upwards along the refrigerant jacket 40.

Next, the refrigerant jacket 40 and the pressing plate 70 are described. The refrigerant jacket 40 is disposed in the region indicated by the double-dotted lines in FIG. 3. The refrigerant jacket 40 is integrated with the printed circuit board 91 and cools the power device 20 by means of refrigerant flowing in the cooling portion 10A, in a state where the cooling portion 10A has been installed. In the present embodiment, the refrigerant jacket 40 has a shape which is long in one direction (the vertical direction in the present embodiment). More specifically, the dimension of the one direction of the refrigerant jacket 40 is greater than the dimension of the refrigerant jacket 40 in the direction perpendicular to the one direction (width direction). The lower end portion of the refrigerant jacket 40 is located at, or in the vicinity of, a position opposing the lower end portion of the printed wiring board 90, and the refrigerant jacket 40 extends upwards from this lower end portion.

Figure 7:
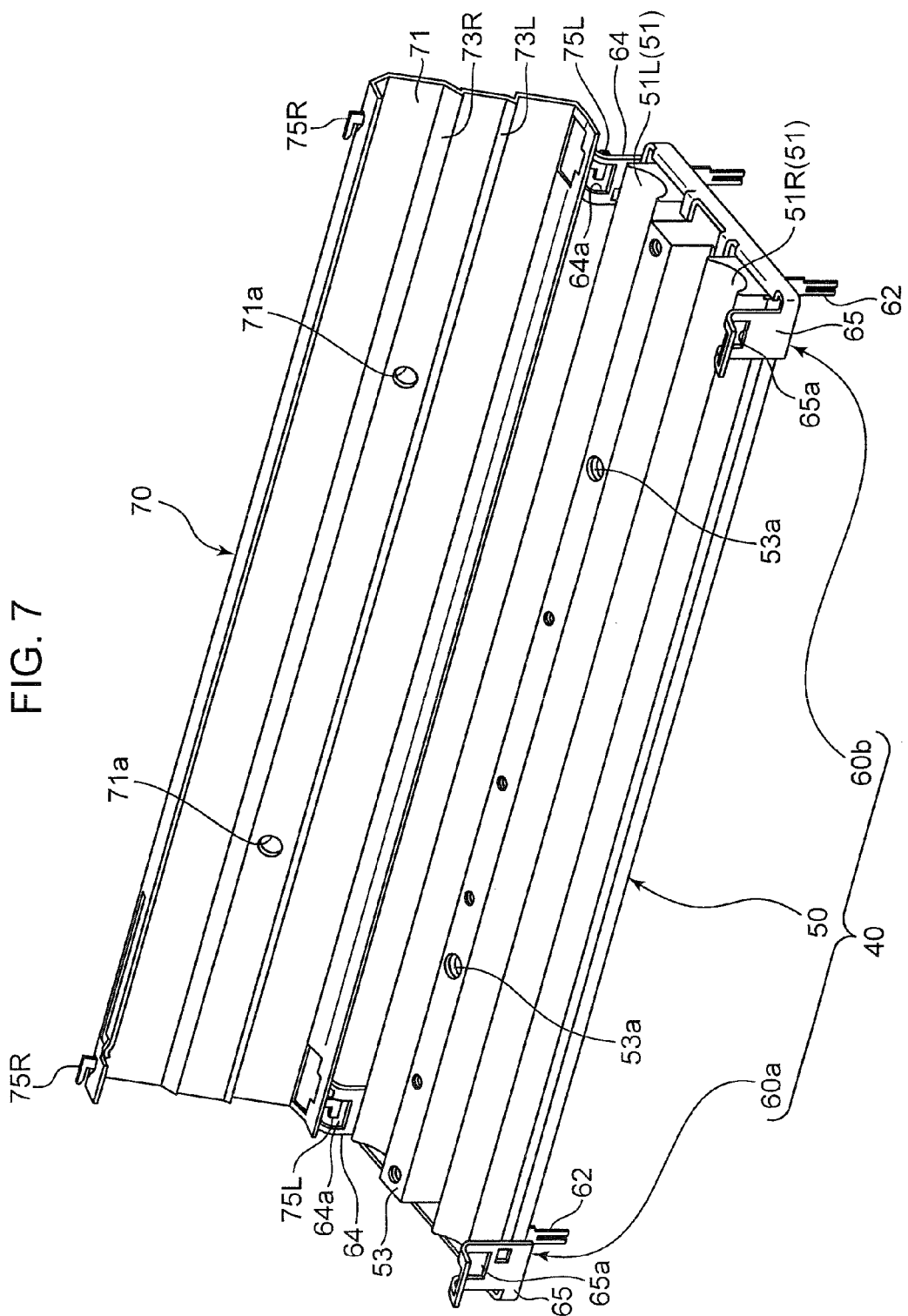
FIG. 7 is a perspective view of a refrigerant jacket in the outdoor unit, which shows a state in which the pressing plate of the refrigerant jacket is open.

As shown in FIG. 7, the refrigerant jacket 40 has a jacket main body 50 which is interposed between the cooling portion 10A of the refrigerant pipe 10 and the power device 20, and supporting legs 60a, 60b for installing the jacket main body 50 on the printed wiring board 90. The jacket main body 50 lies in contact with both the cooling portion 10A and the power device 20.

The jacket main body 50 is made from a material having high thermal conductivity, such as aluminum. The jacket main body 50 is formed by extrusion molding, and has a shape that is long in the one direction. The jacket main body 50 includes an installation and removal surface 51 and a facing surface 52. The facing surface 52 lies in contact with the power device 20. The facing surface 52 faces the printed wiring board 90 in a state of non-contact with the printed wiring board 90. The installation and removal surface 51 enables installation and removal of the cooling portion 10A of the refrigerant pipe 10 on the opposite side of the facing surface 52. In the present embodiment, the jacket main body 50 is formed in a flat shape having a small thickness. The installation and removal surface 51 is provided on one main surface of the jacket main body 50 in the thickness direction thereof, and the facing surface 52 is provided on the other main surface of the jacket main body 50 in the thickness direction thereof.

Figure 8:
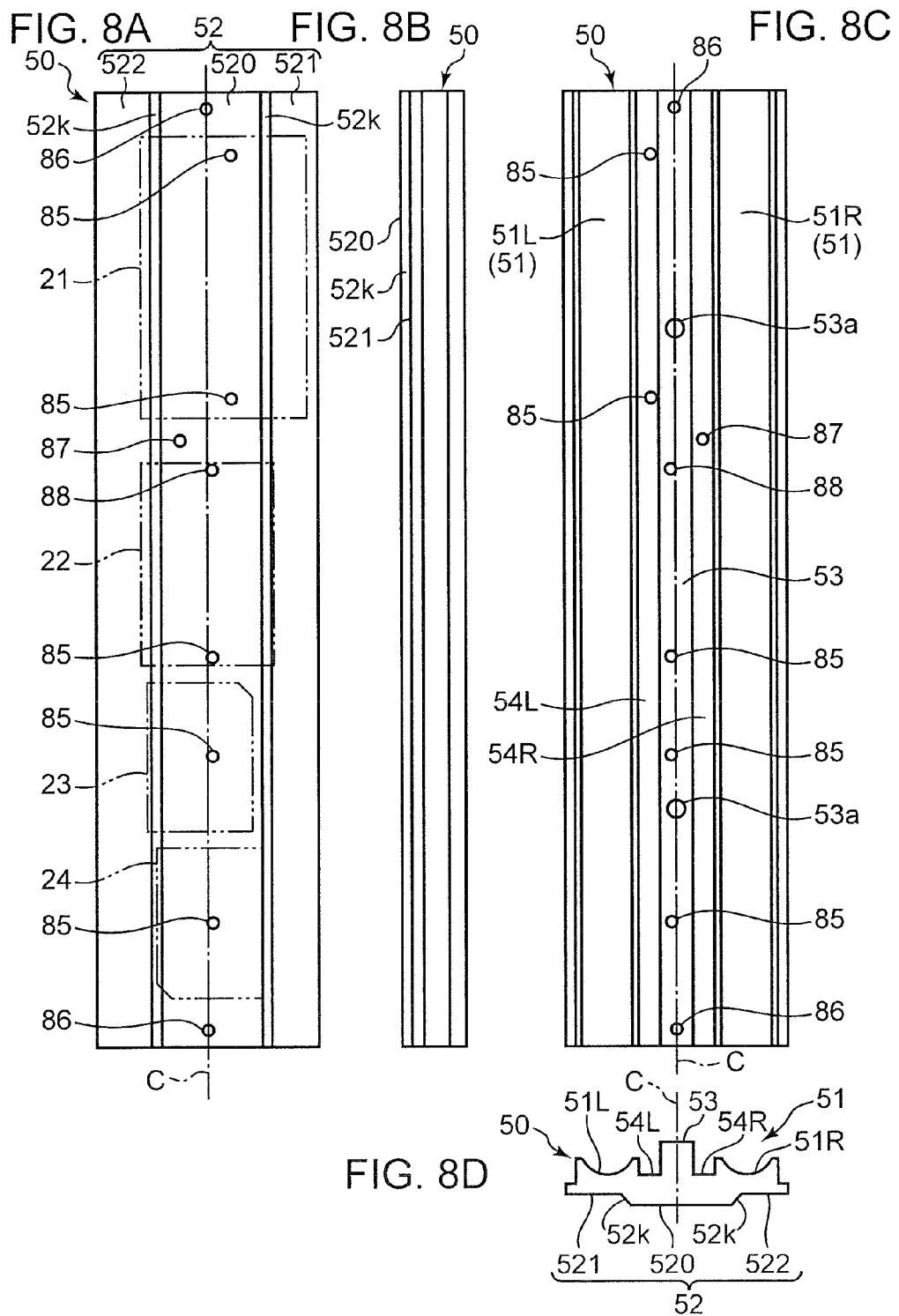
FIG. 8A is a rear view of a jacket main body of the refrigerant jacket.
FIG. 8B is a side view of the jacket main body.
FIG. 8C is a front view of the jacket main body.
FIG. 8D is a bottom view of the jacket main body.

As shown in FIG. 7 and FIGS. 8C and 8D, a pair of grooves (pipe arrangement grooves) 51L, 51R extending in the one direction are provided in the installation and removal surface 51. These grooves 51L, 51R extend, parallel to each other, in the one direction. One of the first cooling portion A1 and the second cooling portion A2 of the cooling portion 10A is disposed in one groove 51R and the other of the first cooling portion A1 and the second cooling portion A2 is disposed in the other groove 51L.

Each of the inner surfaces of the grooves is a curved surface having a semi-circular column shape (a curved surface having a semi-circular arc-shaped cross-sectional form) (see FIG. 5). The diameter of this curved inner surface is substantially the same as or slightly larger than the diameter of the cooling portion 10A which has a circular cross-section. Accordingly, it is possible to achieve a large contact surface area between each of the inner surfaces of the grooves and the outer surface of the cooling portion 10A. Furthermore, by making the diameter of the inner surfaces of the respective grooves substantially the same as or slightly larger than the diameter of the cooling portion 10A, then the cooling portion 10A can readily be installed in and removed from the grooves 51L, 51R of the installation and removal surface 51.

As shown in FIG. 5 and FIGS. 8A, 8B and 8D, the facing surface 52 includes a contact portion 520 which contacts the device main body 200 of the power device 20, a first recessed portion 521 and a second recessed portion 522. The contact portion 520 may also lie in contact with the device main body 200 via a coating material, such as grease, having high thermal conductivity. If the surface of the device main body 200 is a flat surface, then the contact portion 520 is desirably a flat surface, whereby the contact portion 520 makes surface contact with the surface of the device main body 200.

As shown in FIGS. 8A and 8C, a plurality of screw holes 85, 88 for fixing the power device 20 to the contact portion 520, a screw hole 87 for fixing the temperature detection unit T to the contact portion 520, and screw holes 86, 86 for fixing the supporting legs 60a, 60b to the jacket main body 50, are formed in the contact portion 520.

As shown in FIG. 4, FIG. 5 and FIGS. 8B and 8D, the first recessed portion 521 is situated at a position facing the first lead section 201. The first recessed portion 521 is positioned further away from the first lead section 201 of the power device 20, than the contact portion 520. In other words, the first recessed portion 521 is a portion which is recessed so as to be positioned on the side of the installation and removal surface 51, with respect to the contact portion 520. Consequently, a distance (insulation distance) is guaranteed, by which the first recessed portion 521 and the first lead section 201 are in a mutually insulated state. The second recessed portion 522 is situated in a position opposing the second lead section 202. The second recessed portion 522 is positioned further away from the second lead section 202 of the power device 20, than the contact portion 520. In other words, the second recessed portion 522 is a portion which is recessed so as to be positioned on the side of the installation and removal surface 51, with respect to the contact portion 520. Consequently, a distance (insulation distance) is guaranteed, by which the second recessed portion 522 and the second lead section 202 are in a mutually insulated state. The contact portion 520, the first recessed portion 521 and the second recessed portion 522 each extend in the one direction (the vertical direction in the present embodiment).

In the present embodiment, the jacket main body 50 is manufactured by extrusion molding, and therefore the contact portion 520, the first recessed portion 521 and the second recessed portion 522 each have a uniform width from one end to the other end in the lengthwise direction of the jacket main body 50. Furthermore, in order to guarantee an insulation distance with respect to the lead sections 201, 202, the first recessed portion 521 and the second recessed portion 522 each have a shape in which one portion thereof is cut away (cut out) as shown in FIG. 5.

As shown in FIG. 4, FIG. 5 and FIG. 6, the contact portion 520 is provided in a region including the centre lines C, C' which pass through the centre of the jacket main body 50 in the width direction (the direction perpendicular to the one direction). The first recessed portion 521 is provided on one side of the contact portion 520 in the width direction, and the second recessed portion 522 is provided on the other side of the contact portion 520 in the width direction. The centre line C in FIG. 4 is a straight line which is parallel to the lengthwise direction of the jacket main body 50 and which passes through the centre of the jacket main body 50 in the width direction. The centre line C' in FIG. 5 and FIG. 6 is a straight line which is perpendicular to the centre line C and which passes through the centre of the jacket main body 50 in the width direction. The centre line C' is a straight line which is parallel to the thickness direction of the jacket main body 50.

In the present embodiment, the second recessed portion 522 is provided at a position nearer to the centre line C than the first recessed portion 521. The first recessed portion 521 and the second recessed portion 522 are provided in such a manner that, when the jacket main body 50 is viewed from the rear side, the length L2 in the width direction of the second recessed portion 522 is greater than the length L1 in the width direction of the first recessed portion 521. Consequently, it is possible to secure, more reliably, an insulation distance between the second lead section 202 which is connected to the heavy electric part 20P of the first inverter 21, and the second recessed portion 522, and an insulation distance between the second lead section 202 which is connected to the heavy electric part 20P of the second inverter 22, and the second recessed portion 522.

The length L0 in the width direction of the contact portion 520 is greater than the length L1 and is greater than the length L2. Consequently, it is possible to raise the cooling efficiency by enlarging the contact surface area between the contact portion 520 and the power device 20.

As shown in FIG. 5, the centre C1 in the width direction of the device main body 200 of the first inverter 21 is situated in the heavy electric part 20P. This centre C1 is situated on the side of the first recessed portion 521 with respect to the centre line C' in the jacket main body 50. As shown in FIG. 6, the centre C2 in the width direction of the device main body 200 of the second inverter 22 is situated in the heavy electric part 20P. This centre C2 is situated on the side of the first recessed portion 521 with respect to the centre line C' in the jacket main body 50. Consequently, it is possible to enlarge the contact surface area between the heavy electric part 20P and the contact portion 520.

As shown in FIG. 5, the end section 52K on the contact portion 520 side of the first recessed portion 521 is an inclined surface which is inclined with respect to the contact portion 520 so as to slope away from the contact portion 520 in a direction away from the first lead section 201. The end section 52K on the contact portion 520 side of the second recessed portion 522 is an inclined surface which is inclined with respect to the contact portion 520 so as to slope away from the contact portion 520 in a direction away from the second lead section 202. The angle formed between the surface of the contact portion 520 and the inclined surface of each end section 52K is an obtuse angle. This inclined surface may be a flat surface, a convex curved surface or a concave curved surface, or the like.

Since the end sections 52K are each inclined surfaces, the heat of the power device 20 which is transmitted from the contact portion 520 to the jacket main body 50 is transmitted more readily inside the jacket main body 50 in directions along the inclined surfaces (the directions indicated by the arrows in FIG. 5), compared to a case where the end sections 52K are flat surfaces perpendicular to the contact portion 520, rather than inclined surfaces. Consequently, it is possible to raise the capacity of the jacket main body 50 to cool the power device 20.

Furthermore, the one end section 52K (inclined surface) is situated in a position facing in the thickness direction of the jacket main body 50 with respect to the groove 51L, and the other end section 52K (inclined surface) is situated in a position facing in the thickness direction of the jacket main body 50 with respect to the groove 51R. Consequently, the heat of the power device 20 is transmitted more readily to the grooves 51L, 51R.

As shown in FIG. 5 and FIG. 6, in the jacket main body 50, the groove 51L and the first recessed portion 521 are provided at mutually opposing positions in the thickness direction of the jacket main body 50, and the groove 51R and the second recessed portion 522 are provided at mutually opposing positions in the thickness direction of the jacket main body 50. The region between the groove 51L and the first recessed portion 521 in the jacket main body 50 and the region between the groove 51R and the second recessed portion 522 in the jacket main body 50 project outwards in the width direction of the jacket main body 50, with respect to the region where the contact portion 520 is provided. Furthermore, the region between the groove 51R and the second recessed portion 522 in the jacket main body 50 projects outwards in the width direction with respect to the device main body 200. In this composition, a first cooling portion A1 and a second cooling portion A2 having a relatively large size can be disposed on both sides of the device main body 200 in the width direction (on the outer sides thereof in the width direction), and therefore it is possible to raise the capacity for cooling the power device 20.

As shown in FIG. 5, and FIGS. 8C and 8D, a pressing plate installation section 53 for installing the pressing plate 70 is further provided on the installation and removal surface 51 of the jacket main body 50. The pressing plate installation section 53 is formed between the groove 51L and the groove 51R, and has a shape which projects to the side of the pressing plate 70 with respect to the grooves 51L, 51R. This pressing plate installation section 53 is provided substantially in the centre of the jacket main body 50 in the width direction. The pressing plate installation section 53 has a uniform height in the thickness direction of the jacket main body 50 (the vertical direction of the FIG. 5). The pressing plate installation section 53 is formed to have a uniform height throughout the whole of the jacket main body 50 in the lengthwise direction thereof. Furthermore, the pressing plate installation section 53 is formed in such a manner that the facing surface which faces the pressing plate 70 (the upper surface in FIG. 5) is flat. The pressing plate installation section 53 has a fixing tool installation section 53a for securing a fixing tool 80. The fixing tool installation section 53a has a shape which extends in the thickness direction of the jacket main body 50 from the facing surface of the pressing plate installation section 53. In the present embodiment, a screw having a head section and a shaft section connected to this is used as a fixing tool 80, and the fixing tool installation section 53a is a screw hole into which the shaft section is screw fitted, but the invention is not limited to this.

On the installation and removal surface 51 of the jacket main body 50, a withdrawn section 54L is provided at a position opposing an elastic deformation section 73L (described hereinafter) of the pressing plate 70, when the pressing plate 70 is in a closed state, and a withdrawn section 54R is provided at a position opposing an elastic deformation section 73R (described hereinafter) of the pressing plate 70. The withdrawn section 54L is formed between the groove 51L and the pressing plate installation section 53, and has a shape which avoids interference with the elastic deformation section 73L (in the present embodiment, a recessed shape). The withdrawn section 54R is formed between the groove 51R and the pressing plate installation section 53, and has a shape which avoids interference with the elastic deformation section 73R (in the present embodiment, a recessed shape).

The screw holes 85, 86, 87, 88 of the jacket main body 50 are provided at positions where they do not interfere with the undulating portion of the jacket main body 50. In other words, the screw holes 85, 86, 87, 88 are provided in either the recessed portion or the projecting portions of the installation and removal surface 51, and are not formed so as to span the recessed portion and the projecting portions in the installation and removal surface 51. Consequently, it is possible to prevent the occurrence of burr due to the formation of the screw holes.

More specifically, in the front view shown in FIG. 8C, the screw holes 85, 86, 87, 88 are provided either within the range of the pressing plate installation section 53, or within the range of the withdrawn section 54L or within the range of the withdrawn section 54R. In other words, the screw holes are not provided at positions spanning the pressing plate installation section 53 and the withdrawn section 54L, or positions spanning the plate installation section 53 and the withdrawn section 54R.

The two screw holes 85 are provided at positions passing through the withdrawn section 54L and the contact portion 520. The screw hole 87 is provided at a position passing through the withdrawn section 54R and the contact portion 520. The plurality of screw holes 85, 86, 88 are provided at positions passing through the pressing plate installation section 53 and the contact portion 520. In a similar fashion, the two fixing tool installation sections 53a which are described below are not provided so as to span the recessed section and the projecting section, but rather are provided at positions that pass between the pressing plate installation section 53 and the contact portion 520.

Figure 9:
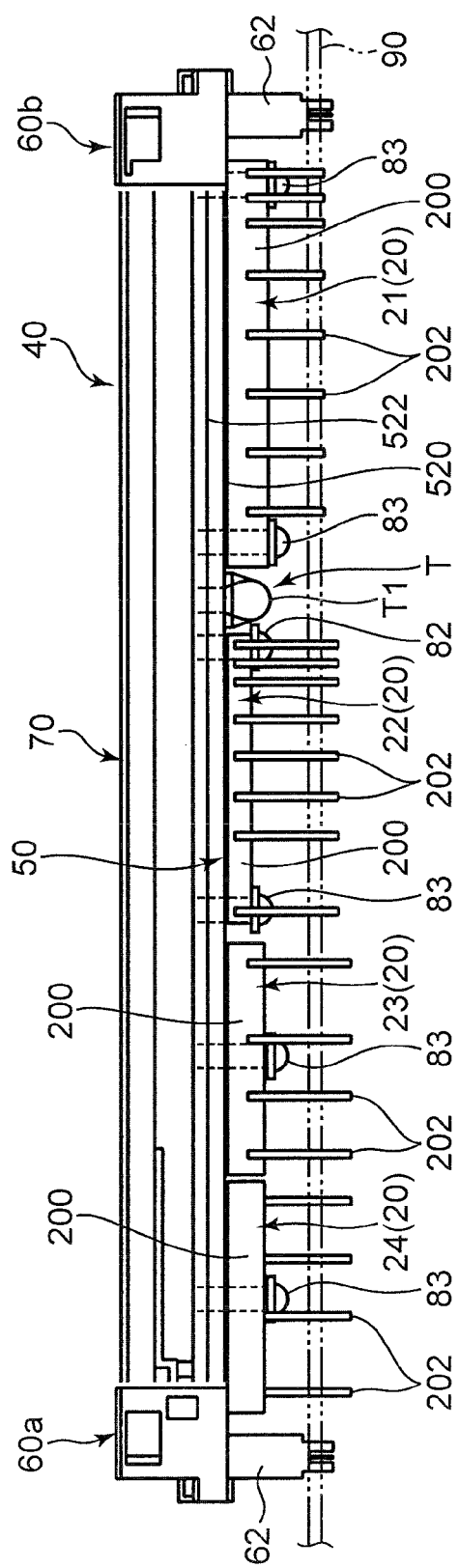
FIG. 9 is a side view showing the refrigerant jacket, the power device and the temperature detection unit.
Figure 10:
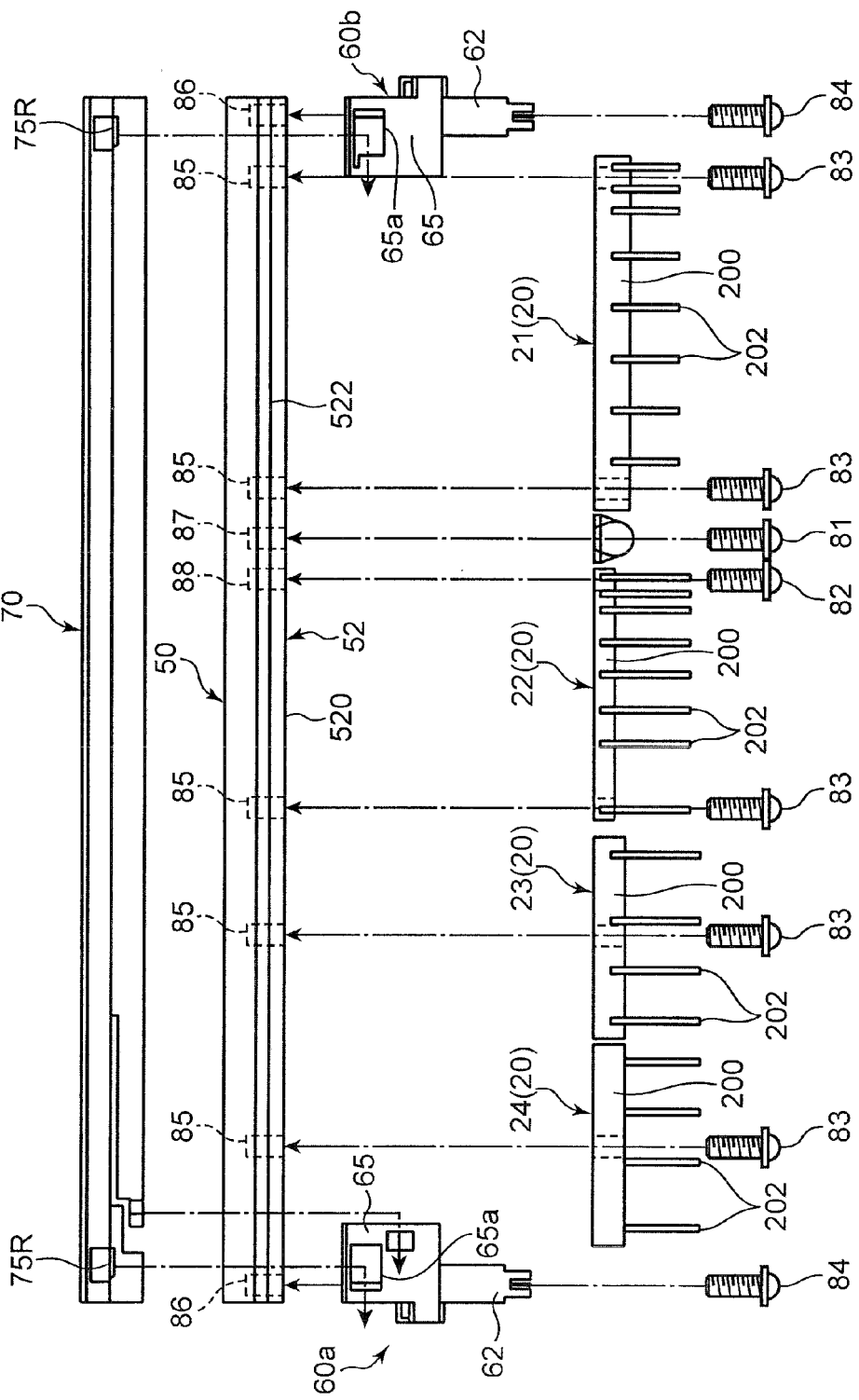
FIG. 10 is an exploded view of FIG. 9.

As shown in FIG. 9, the supporting legs 60a, 60b are used to install the jacket main body 50 on the printed wiring board 90. As shown in FIG. 7 and FIG. 10, the first supporting leg 60a is fixed by a screw 84 (see FIG. 10) which is screwed into the screw hole 86 in one end of the lengthwise direction of the jacket main body 50, and the second supporting leg 60b is fixed by a screw 84 (see FIG. 10) which is screwed into the screw hole 86 in the other end.

The first supporting leg 60a includes an installation section 62 for installing on the printed wiring board 90, a coupling section 64 which couples with the pressing plate 70 and serves as a rotating section when the pressing plate 70 opens and closes, and a coupling section 65 for maintaining the pressing plate 70 in the closed state. Similarly, the second supporting leg 60b includes an installation section 62 for installing on the printed wiring board 90, a coupling section 64 which couples with the pressing plate 70 and serves as a rotating section when the pressing plate 70 opens and closes, and a coupling section 65 for maintaining the pressing plate 70 in the closed state. The coupling section 64 is provided on one side in the breadthways direction of the pressing plate 70, and the coupling section 65 is provided on the opposite side from the coupling section 64, in the breadthways direction of the pressing plate 70.

Each of the installation sections 62 is set to a dimension which can guarantee a space for disposing a power device 20 between the surface of the printed wiring board 90 and the contact portion 520. The front end sections of the installation sections 62 are fixed to the printed wiring board 90 (see FIG. 9). As shown in FIG. 7, the coupling sections 64 each have an insertion hole 64a into which the coupling section 75L of the pressing plate 70 (described below) is inserted. The coupling sections 65 each have an insertion hole 65a into which the coupling section 75R of the pressing plate 70 (described below) is inserted.

The pressing plate 70 serves to sandwich the cooling portion 10A of the refrigerant pipe 10, against the refrigerant jacket 40. The pressing plate 70 is installed on the installation and removal surface 51 side of the refrigerant jacket 40. The pressing plate 70 can be positioned in a closed state where the cooling portion 10A of the refrigerant pipe 10 is sandwiched between the refrigerant jacket 40 and the pressing plate 70 (see FIG. 5 and FIG. 11) in order to press the cooling portion 10A against the installation and removal surface 51, and an open state where the cooling portion 10A can be installed on and removed from the installation and removal surface 51 (see FIG. 7).

The pressing plate 70 has a long shape in the same direction as the lengthwise direction of the refrigerant jacket 40 (the one direction described above). In the present embodiment, the pressing plate 70 is formed from a single metal sheet, but the invention is not limited to this. The pressing plate 70 has a shape whereby it is pressed towards the refrigerant jacket 40 by the fixing tool 80, as well as covering the cooling portion 10A.

The pressing plate 70 has a pressed section 71 which is pressed towards the refrigerant jacket 40 by the fixing tool 80, pressing sections 72L, 72R, elastic deformation sections 73L, 73R, and the coupling sections 75L, 75R described above. This pressing plate 70 has a rigidity which permits correction of twisting of the cooling portion 10A of the refrigerant pipe 10 when the pressed section 71 is pressed towards the refrigerant jacket 40 by the fixing tool 80.

The pressed section 71 is formed so as to extend in the lengthwise direction in substantially the centre of the width direction of the pressing plate 70, and has a flat shape. This pressed section 71 has an insertion hole 71a for inserting a shaft section of the fixing tool 80. Thereupon, by fixing the shaft section of the fixing tool 80 which has been inserted into the insertion hole 71a, into the fixing tool installation section 53a of the jacket main body 50, the pressed section 71 is pressed towards the pressing plate installation section 53 by the head section of the fixing tool 80.

The pressing section 72L is supported by the pressed section 71 which is connected to same via the elastic deformation section 73L. This pressed section 72L is a portion which presses the cooling portion 10A of the refrigerant pipe 10 against the groove 51L, when the pressed section 71 is pressed towards the jacket main body 50 by the fixing tool 80. The pressing section 72L has a shape which is long in the same direction as the lengthwise direction of the cooling portion 10A of the refrigerant pipe 10, and presses the whole of the portion of the cooling portion 10A of the refrigerant pipe 10 which is mounted in the groove 51L, against the surface of the groove 51L. The pressing section 72R has a shape that is symmetrical to the pressing section 72L, with respect to the pressed section 71, and therefore description thereof is omitted here.

The elastic deformation section 73L is formed between the pressed section 71 and the pressing section 72L, and has a shape which extends so as to reach from one end to the other end of the pressing plate 70 in the lengthwise direction thereof. The elastic deformation section 73L has a projecting shape which protrudes towards the side of the jacket main body 50, as well as being long in the lengthwise direction of the pressing plate 70 (the direction in which the cooling portion 10A of the refrigerant pipe 10 extends). By having the protruding shape of this kind, the elastic deformation section 73L has a function for raising the rigidity of the pressing plate 70. This elastic deformation section 73L deforms elastically so as to allow the pressing section 72L to be displaced in a direction away from the jacket main body 50 due to receiving a reaction force from the cooling portion 10A of the refrigerant pipe 10, when the pressed section 71 is pressed towards the jacket main body 50 by the fixing tool 80 (the angle θ shown in FIGS. 5 and 6 changes). The elastic deformation section 73L has a shape which projects towards the side of the refrigerant jacket 40, from the pressed section 71, but the dimension of this projection is smaller than the dimension between the bottom section of the withdrawn section 54L and the upper face of the pressing plate installation section 53, and consequently there is no interference between the elastic deformation section 73L and the withdrawn section 54L. The elastic deformation section 73R has a shape that is symmetrical to the elastic deformation section 73L, with respect to the pressed section 71, and therefore description thereof is omitted here.

The coupling sections 75L, 75R have a portion extending in the width direction of the pressing plate 70 (the breadthways direction), and a portion extending in the lengthwise direction. In other words, the coupling sections 75L, 75R each have an L-shaped portion.

Figure 11:
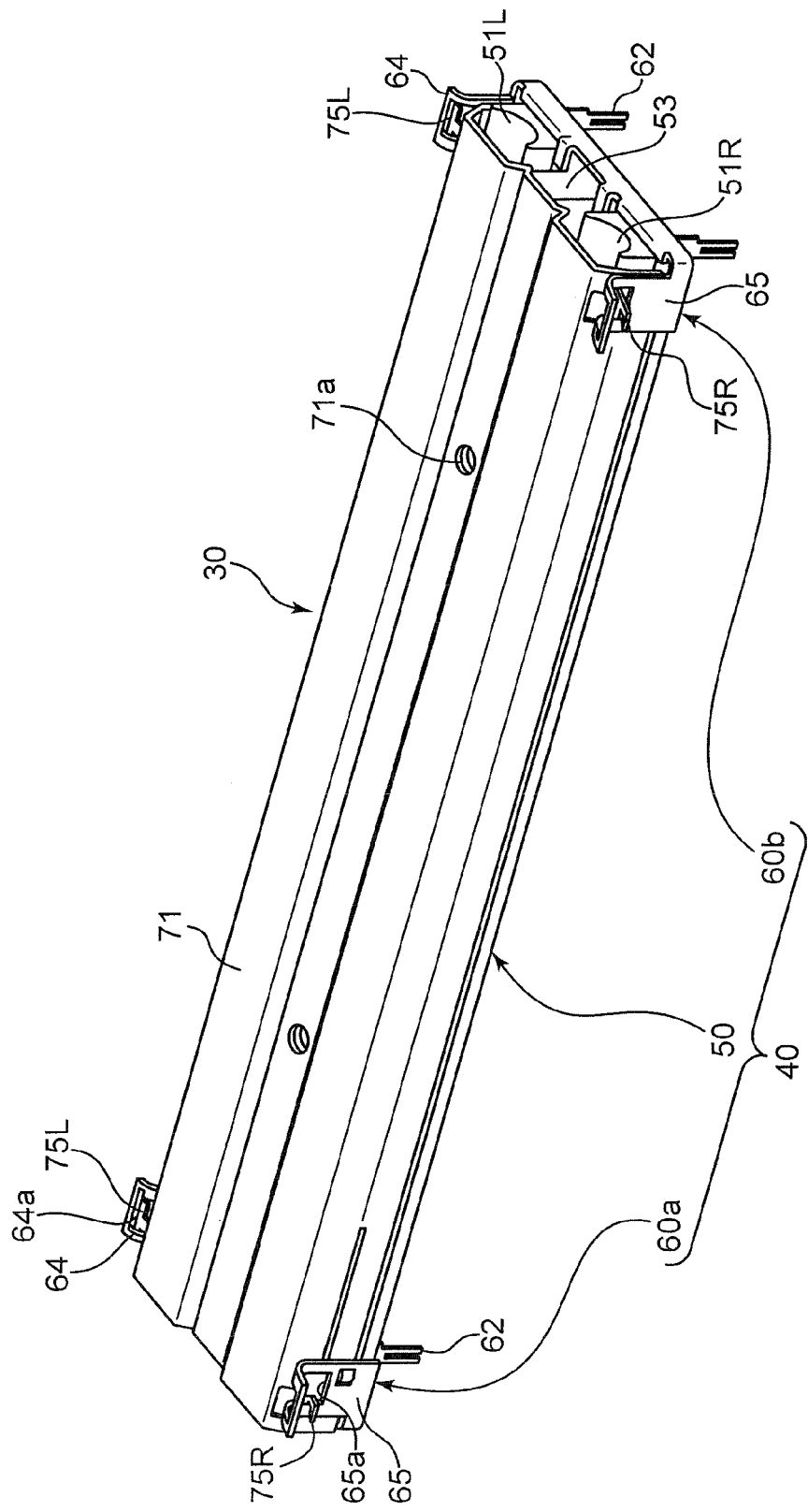
FIG. 11 is a perspective view of the refrigerant jacket, which shows a state in which the pressing plate of the refrigerant jacket is closed.

The procedure for installing the pressing plate 70 on the refrigerant jacket 40 is as follows. Firstly, as shown in FIG. 7, the coupling sections 75L of the pressing plate 70 are inserted into the insertion hole 64a of the corresponding coupling section 64 of the refrigerant jacket 40, thereby coupling these members together (open state). Thereupon, the pressing plate 70 is rotated about the coupled portion of the coupling section 64 and the coupling section 75L. By this means, as shown in FIG. 11, the pressing plate 70 comes to face the installation and removal surface 51 of the refrigerant jacket 40 (closed state). In FIG. 11, the cooling portion 10A of the refrigerant pipe 10 is not depicted, but as shown in FIG. 5, the cooling portion 10A is interposed between the refrigerant jacket 40 and the pressing plate 70, and by assuming the abovementioned closed state, the cooling portion 10A is pressed against the installation and removal surface 51 of the refrigerant jacket 40, and the cooling portion 10A makes surface contact with the installation and removal surface 51.

In the closed state, the coupling sections 75L, 75R of the pressing plate 70 are inserted into the insertion holes 65a of the corresponding coupling sections 65. In this case, by a sliding movement of the pressing plate 70 in the lengthwise direction thereof, the L-shaped portions of the coupling sections 75L, 75R are more securely coupled to the corresponding insertion holes.

The temperature detection unit T serves to detect the temperature of the power device 20. In the present embodiment, the temperature detection unit T is a thermistor (fin thermistor), but the temperature detection unit T is not limited to being a thermistor, provided that it is capable of detecting the temperature of the power device 20.

As shown in FIG. 4 and FIG. 9, the temperature detection unit T is installed on the facing surface 52 of the refrigerant jacket 40. In particular, in the present embodiment, the temperature detection unit T is installed on the contact portion 520 of the facing surface 52. Furthermore, the temperature detection unit T is disposed at a position nearer to the inverters 21, 22 than the converters 23, 24. The temperature detection unit T is disposed between the first inverter 21 and the second inverter 22. The first inverter 21 and the second inverter 22 are spaced apart so as to enable the arrangement of the temperature detection unit T therebetween.

The temperature detection unit T includes a screw fastening section T1 having a screw hole T3 into which a first screw 81 is inserted, and an extension section T2 which extends along the facing surface 52 from the screw fastening section T1. The temperature detection unit T has a shape which is long in the direction along the facing surface 52, and is disposed so as to extend along the contact portion 520. The temperature detection unit T is fixed to the jacket main body 50 by the first screw 81 which is screw fitted into the screw hole 87 formed in the contact portion 520 of the jacket main body 50. As shown in FIG. 4, a long thin wire W is connected to the temperature detection unit T in order to carry the detected signal to the printed circuit board 91. The end of the wire W of the temperature detection unit T is connected to the printed circuit board 91 of the electric component module 100.

Here, as shown in FIG. 4, FIGS. 8A and 8C, FIG. 9 and FIG. 10, the device main body 200 of the first inverter 21 is fixed to the jacket main body 50 by the screws 83 which are screw fitted into the screw holes 85 formed in the contact portion 520 of the jacket main body 50. The device main body 200 of the first converter 23 is fixed to the jacket main body 50 by the screws 83 which screw fit into the screw holes 85 formed in the contact portion 520. The device main body 200 of the second converter 24 is fixed to the jacket main body 50 by the screws 83 which screw fit into the screw holes 85 formed in the contact portion 520.

The device main body 200 of the second inverter 22 is fixed to the jacket main body 50 by the screws 83 which are screw fitted into the screw holes 85 formed in the contact portion 520 of the jacket main body 50, and a second screw 82 which is screw fitted into a screw hole 88. As shown in FIG. 4, this second screw 82 is provided at a position which restricts rotation of the temperature detection unit T about the screw hole T3, due to the extension section T2 of the temperature detection unit T abutting against the second screw 82.

In other words, the second screw 82 serves both a function of fixing the second inverter 22 to the jacket main body 50 and a function of restricting rotation of the temperature detection unit T. Consequently, in the step of installing the temperature detection unit T on the installation and removal surface 51, the first screw 81 which has been inserted into the screw hole T3 of the screw fastening section T1 is rotated by a tool, and when screw fixing the first screw 81 into the screw hole 87, further rotation of the temperature detection unit T about the screw hole T3 is restricted due to the extension section T2 abutting against the second screw 82.

In an air-conditioning apparatus 1 such as that described above, when a refrigeration cycle is implemented, the power device 20 is driven and the heat generating part thereof generates heat, but the power device 20 is cooled by the cooler 30. In other words, the power device 20 is cooled by exchange of heat with the refrigerant flowing in the cooling portion 10A, via the refrigerant jacket 40 and the cooling portion 10A of the refrigerant pipe 10.

As described above, in the present embodiment, it is possible to cool the power device 20 by a refrigerant flowing in the cooling portion 10A of the refrigerant pipe 10 due to the refrigerant jacket 40 being caused to make contact with the device main body 200 in the contact portion 520. Therefore, while ensuring cooling properties in this way, an insulation distance between the refrigerant jacket 40 and the first lead section 201 can be secured in the first recessed portion 521 on one side of the contact portion 520, and an insulation distance between the refrigerant jacket 40 and the second lead section 202 can be secured in the second recessed portion 522 on the other side of the contact portion 520.

Consequently, in the present embodiment, it is possible to omit the insulation sheet which has been provided between the refrigerant jacket and the power device in a conventional refrigeration apparatus, while ensuring insulating properties between the refrigerant jacket 40 and the lead sections 201, 202 of the power device 20.

Furthermore, in the present embodiment, the jacket main body 50 of the refrigerant jacket 40 has a long shape in one direction which is formed by extrusion molding, and the contact portion 520, the first recessed portion 521 and the second recessed portion 522 each extend in the one direction. Consequently, it is possible to manufacture the jacket main body 50 of the refrigerant jacket 40 efficiently by extrusion molding. Moreover, the jacket main body 50 which is obtained by extrusion molding has a structure in which the contact portion 520, the first recessed portion 521 and the second recessed portion 522 extend in the one direction, and therefore simply by disposing the power device 20 in a state where the device main body 200 is made to contact the contact portion 520, the first lead section 201 faces the first recessed portion 521, and the second lead section 202 faces the second recessed portion 522, it is possible to cool the power device 20, as well as being able to guarantee an insulation distance between the refrigerant jacket 40, the first lead section 201 and the second lead section 202.

Furthermore, in the present embodiment, since the end section 52K on the side of the contact portion 520 in the first recessed portion 521 and the end section 52K on the side of the contact portion 520 in the second recessed portion 522 have inclined surfaces, then an excellent capacity in transmitting the heat of the power device 20 to the cooling portion 10A is obtained, while ensuring an insulation distance between the jacket main body 50 of the refrigerant jacket 40 and the first lead section 201 and the second lead section 202. In other words, it is possible to raise the capacity of the refrigerant jacket 40 to transmit the heat of the power device 20 to the cooling portion 10A, compared to a case where the end sections 52K have a flat surface perpendicular to the contact portion 520, rather than an inclined surface.

Moreover, in the present embodiment, it is possible to more reliably secure an insulation distance between the second recessed portion 522 and the second lead section 202 which is connected to the heavy electric part 20P of the device main body 200, due to the fact that the width L2 of the second recessed portion 522 is made larger than the width L1 of the first recessed portion 521.

Furthermore, in the present embodiment, since the second recessed portion 522 is provided at a position nearer to the centre line C in the width direction of the jacket main body 50 of the refrigerant jacket 40, compared to the first recessed portion 521, then the insulation distance between the second lead section 202 and the second recessed portion 522 can be guaranteed more readily.

Other Embodiments

The present invention is not limited to the embodiment described above and various modifications, improvements, and the like can be applied within a scope that does not depart from the essence of the invention.

In the embodiment described above, an example is given in which the power device 20 includes two inverters 21, 22 and two converters 23, 24, but the invention is not limited to this. For instance, the power device 20 may include one inverter and one converter. Furthermore, the power device 20 may include three or more inverters and three or more converters.

In the embodiment described above, an example is given in which the jacket main body 50 is manufactured by extrusion molding, but the invention is not limited to this and it is also possible to use another molding means.

In the embodiment described above, an example is given in which the end section 52K of the first recessed portion 521 and the end section 52K of the second recessed portion 522 are inclined surfaces, but the invention is not limited to this.

In the embodiment described above, an example is given in which the width L2 of the second recessed portion 522 is greater than the width L1 of the first recessed portion 521, but the invention is not limited to this. For example, the width L2 may be approximately the same as the width L1.

In the embodiment described above, an example is given in which the second recessed portion 522 is provided at a position near to the centre line C in the width direction of the jacket main body 50, compared to the first recessed portion 521, but the invention is not limited to this. For example, the distance between the second recessed portion 522 and the centre line C and the distance between the first recessed portion 521 and the centre line C may be approximately the same.

In the present embodiment, an example is given in which the cooling portion 10A of the refrigerant pipe 10 is disposed in the groove of the refrigerant jacket 40, but the invention is not limited to this. Provided that a large contact surface area can be obtained between the cooling portion 10A and the refrigerant jacket 40, the refrigerant jacket 40 does not necessarily have to be provided with grooves.

In the embodiment described above, an example is given in which the pressing plate 70 has a size that is capable of covering substantially the whole of the jacket main body 50, but the invention is not limited to this. The pressing plate 70 is required to be capable of pressing the cooling portion 10A of the refrigerant pipe 10 against the installation and removal surface 51, and therefore the pressing plate 70 may be smaller than the jacket main body 50.

In the embodiment described above, an example is given in which the cooler 30 includes the pressing plate 70, but the invention is not limited to this. Provided that a structure is adopted in which the cooling portion 10A can maintain a state of contact with the installation and removal surface 51 during operation of the refrigeration apparatus 1, and the cooling portion 10A can be removed from the installation and removal surface 51 during, for example, maintenance service, it is possible to omit the pressing plate 70, and it is also possible to adopt another supporting member instead of the pressing plate 70. As means for omitting the pressing plate 70, it would be possible to adopt a method which makes the internal diameter of the grooves 51L, 51R of the refrigerant jacket 40 substantially the same as the outer shape of the cooling portion 10A, to an extent whereby the cooling portion 10A can be installed and removed, while being able to hold the cooling portion 10A.

In the embodiment described above, an example is given in which screws are screw fitted into screw holes as means for installing the power device 20 on the facing surface 52, but the invention is not limited to this, and it is also possible to use another fixing means.

In the embodiment described above, an example is given in which the refrigerant jacket 40 includes a jacket main body 50 and supporting legs 60a, 60b, and the jacket main body 50 and the supporting legs 60a, 60b are separate bodies, but the invention is not limited to this. For example, the jacket main body 50 and the supporting legs 60a, 60b may be formed in an integrated fashion.

In the embodiment described above, an example is given in which the refrigeration apparatus is an air-conditioning apparatus, but the invention is not limited to this. The refrigeration apparatus may be, for example, a hot water supply apparatus or a cooling apparatus, or the like, which is provided with a water-cooling type of heat exchanger, instead of the air-cooling type of indoor heat exchanger 11.

An overview of the embodiments described above is as follows.

The refrigeration apparatus has a refrigerant circuit. The refrigeration apparatus includes: a power device; a printed wiring board on which the power device is mounted; a refrigerant pipe through which a refrigerant of the refrigerant circuit flows; and a refrigerant jacket which has a facing surface that is in contact with the power device and faces the printed wiring board, the refrigerant jacket cooling the power device by refrigerant flowing in a cooling portion, which is a portion of the refrigerant pipe.

The power device includes: a device main body; a first lead section which extends towards the printed wiring board from one side of the device main body and which is connected to the printed wiring board; and a second lead section which extends towards the printed wiring board from the other side of the device main body and which is connected to the printed wiring board.

The facing surface of the refrigerant jacket includes: a contact portion which contacts the device main body; a first recessed portion which faces the first lead section and secures an insulation distance to the first lead section due to being positioned further away from the power device than the contact portion; and a second recessed portion which faces the second lead section and secures an insulation distance to the second lead section due to being positioned further away from the power device than the contact portion.

In this composition, it is possible to cool the power device by a refrigerant which flows in a cooling portion of the refrigerant pipe, due to the refrigerant jacket making contact with the device main body, in the contact portion. More specifically, the refrigeration apparatus is premised on not impeding the cooling properties of the refrigeration jacket. Therefore, while ensuring cooling properties in this way, an insulation distance between the refrigerant jacket and the first lead section can be secured in the first recessed portion on one side of the contact portion, and an insulation distance between the refrigerant jacket and the second lead section can be secured in the second recessed portion on the other side of the contact portion.

Consequently, with this composition, it is possible to omit the insulation sheet which has been provided between the refrigerant jacket and the power device in a conventional refrigeration apparatus, while ensuring insulating properties between the refrigerant jacket and the lead sections of the power device.

In the refrigeration apparatus, desirably, the refrigerant jacket has a shape that is long in one direction and is formed by extrusion molding; and the contact portion, the first recessed portion and the second recessed portion each extend in the one direction.

With this composition, it is possible to manufacture the refrigerant jacket efficiently by extrusion molding. Moreover, the refrigeration jacket which is obtained by extrusion molding has a structure in which the contact portion, the first recessed portion and the second recessed portion extend in the one direction, and therefore simply by disposing the power device in a state where the device main body is made to contact the contact portion, the first lead section faces the first recessed portion, and the second lead section faces the second recessed portion, it is possible to cool the power device, as well as being able to guarantee an insulation distance between the refrigerant jacket, the first lead section and the second lead section.

In the refrigeration apparatus, desirably, the end section on the contact portion side of the first recessed portion is an inclined surface that slopes away from the contact portion, in a direction away from the first lead section; and the end section on the contact portion side of the second recessed portion is an inclined surface that slopes away from the contact portion, in a direction away from the second lead section.

With this composition, since the end section on the contact portion side of the first recessed portion and the end section on the contact portion side of the second recessed portion are inclined surfaces, then an excellent capacity for transmitting the heat of the power device to the cooling portion is achieved, while ensuring an insulation distance between the refrigeration jacket, the first lead section and the second lead section. In other words, it is possible to raise the capacity of the refrigerant jacket to transmit the heat of the power device to the cooling portion, compared to a case where the end sections have a flat surface perpendicular to the contact portion, rather than an inclined surface.

In the refrigeration apparatus, desirably, the device main body includes: a signal part which is positioned on the first lead section side and is connected to the first lead section; and a heavy electric part which is positioned on the second lead section side, is connected to the second lead section, and is more liable to generate heat than the signal part; and the width of the second recessed portion is greater than the width of the first recessed portion.

With this composition, it is possible to secure more reliably (preferentially) an insulation distance between the second recessed portion and the second lead section which is connected to the heavy electric part of the device main body, by making the width of the second recessed portion greater than the width of the first recessed portion.

In the refrigeration apparatus described above, if the second recessed portion is provided at a position nearer to the centre in the width direction of the refrigeration jacket than the first recessed portion, then an insulation distance between the second lead section and the second recessed portion is secured more readily.

1 air-conditioning apparatus
2 outdoor unit
3 indoor unit
4 refrigerant circuit
10 refrigerant pipe
10A cooling portion of refrigerant pipe
20 power device 20P heavy electric part
20S signal part
200 device main body
201 first lead section
202 second lead section
21 first inverter
22 second inverter
23 first converter
24 second converter
30 cooler
40 refrigerant jacket
51 installation and removal surface
52 facing surface
520 contact portion
521 first recessed portion
522 second recessed portion
90 printed wiring board
91 printed circuit board
100 electric component module
C centre of width direction of jacket main body in refrigerant jacket
L1 width of first recessed portion
L2 width of second recessed portion

The invention claimed is:

1. A refrigeration apparatus having a refrigerant circuit, comprising:
 a power device;
 a printed wiring board on which the power device is mounted;
 a refrigerant pipe through which a refrigerant of the refrigerant circuit flows; and
 a refrigerant jacket which has a facing surface that is in contact with the power device and faces the printed wiring board, the refrigerant jacket cooling the power device by refrigerant flowing in a cooling portion, which is a portion of the refrigerant pipe, wherein
 the power device includes:
  a device main body having at least an upper surface, a bottom surface, and two side surfaces;
  a first lead section which extends towards the printed wiring board from one of the two side surfaces of the device main body and which is connected to the printed wiring board; and
  a second lead section which extends towards the printed wiring board from the other of the two side surfaces of the device main body and which is connected to the printed wiring board; and
 the facing surface of the refrigerant jacket includes:
 a contact portion which contacts the device main body, a centre of the contact portion being to the left or right of a centre of the power device in a direction parallel to a direction which the first lead section extends;
 a first recessed portion which faces the first lead section and secures an insulation distance to the first lead section due to being positioned further away from the power device in a direction perpendicular to the direction in which the first lead section extends than the contact portion, the first recessed portion having a length L1 in a direction parallel with the direction the first lead section extends; and
 a second recessed portion which faces the second lead section and secures an insulation distance to the second lead section due to being positioned further away from the power device in a direction perpendicular to a direction in which the second lead section extends than the contact portion, the second recessed portion having a length L2 in a direction parallel with the direction the second lead section extends which is larger than the length L1 of the first recessed portion;
 an end section on the contact portion side of the first recessed portion is an inclined surface that slopes away from the contact portion, in a direction away from the first lead section; and
 an end section on the contact portion side of the second recessed portion is an inclined surface that slopes away from the contact portion, in a direction away from the second lead section.

2. The refrigeration apparatus according to claim 1, wherein
 the refrigerant jacket has a shape that is long in one direction and is formed by extrusion molding; and
 the contact portion, the first recessed portion and the second recessed portion each extend in the one direction.

3. A refrigeration apparatus having a refrigerant circuit, comprising:
 a power device;
 a printed wiring board on which the power device is mounted;
 a refrigerant pipe through which a refrigerant of the refrigerant circuit flows; and
 a refrigerant jacket which has a facing surface that is in contact with the power device and faces the printed wiring board, the refrigerant jacket cooling the power device by refrigerant flowing in a cooling portion, which is a portion of the refrigerant pipe, wherein
 the power device includes:
 a device main body having at least an upper surface, a bottom surface, and two side surfaces;
 a first lead section which extends towards the printed wiring board from one of the two side surfaces of the device main body and which is connected to the printed wiring board; and
 a second lead section which extends towards the printed wiring board from the other of the two side surfaces of the device main body and which is connected to the printed wiring board; and
 the facing surface of the refrigerant jacket includes:
 a contact portion which contacts the device main body, a centre of the contact portion being to the left or right of a centre of the power device in a direction parallel to a direction which the first lead section extends;
 a first recessed portion which faces the first lead section and secures an insulation distance to the first lead section due to being positioned further away from the power device in a direction perpendicular to the direction in which the first lead section extends than the contact portion, the first recessed portion having a length L1 in a direction parallel with the direction the first lead section extends; and
 a second recessed portion which faces the second lead section and secures an insulation distance to the second lead section due to being positioned further away from the power device in a direction perpendicular to a direction in which the second lead section extends than the contact portion, the second recessed portion having a length L2 in a direction parallel with the direction the second lead section extends which is larger than the length L1 of the first recessed portion;
 the device main body includes:
 a signal part which is positioned on the first lead section side and is connected to the first lead section; and
 a heavy electric part which is positioned on the second lead section side, is connected to the second lead section, and is more liable to generate heat than the signal part; and a width of the second recessed portion is greater than a width of the first recessed portion.

4. The refrigeration apparatus according to claim 3, wherein the second recessed portion is provided at a position nearer to a centre in a width direction of the refrigerant jacket, than the first recessed portion.

5. The refrigeration apparatus according to claim 1, wherein the device main body includes:
- a signal part which is positioned on the first lead section side and is connected to the first lead section; and
- a heavy electric part which is positioned on the second lead section side, is connected to the second lead section, and is more liable to generate heat than the signal part; and
- a width of the second recessed portion is greater than a width of the first recessed portion.

* * * * *